United States Patent [19]

Bochkarev et al.

[11] 4,262,630

[45] Apr. 21, 1981

[54] METHOD OF APPLYING LAYERS OF SOURCE SUBSTANCE OVER RECIPIENT AND DEVICE FOR REALIZING SAME

[76] Inventors: Ellin P. Bochkarev, Khlebozavodskoi proezd, 3, kv. 16; Nikolai G. Voronin, ulitsa Petrozavodskaya, 15, korpus 2, kv. 164; Oleg E. Korobov, Golikovsky pereulok, 13, kv. 6; Vadim N. Maslov, ulitsa A. Tolstogo, 22/2, kv. 101, all of Moscow; Irina B. Nikitina, Radiotsentr 5, 9, kv. 3, Schelkovo Moskovskoi oblasti, all of U.S.S.R.

[21] Appl. No.: 955,024

[22] Filed: Oct. 25, 1978

Related U.S. Application Data

[63] Continuation of Ser. No. 756,609, Jan. 4, 1977, abandoned.

[51] Int. Cl.$^3$ .............................................. C23C 13/08
[52] U.S. Cl. .................................... 118/715; 118/729; 427/51; 427/86; 427/87; 427/91; 427/109; 427/255; 427/331; 427/248.1
[58] Field of Search ................... 118/49.1, 49.5, 715, 118/729; 427/109, 255, 86, 87, 248 R, 51, 91, 331, 248.1

[56] References Cited

U.S. PATENT DOCUMENTS

| | | | |
|---|---|---|---|
| 2,884,345 | 4/1959 | Rocard et al. | 427/248 R |
| 2,936,256 | 5/1960 | Hanlet | 427/248 R |
| 3,023,727 | 3/1962 | Theodoseau et al. | 427/109 |
| 3,312,190 | 4/1967 | Bradshaw | 118/49.1 |
| 3,379,819 | 4/1968 | Houde | 118/49.1 |
| 3,382,843 | 5/1968 | Thelen et al. | 118/49.1 |
| 3,425,878 | 2/1969 | Dersin et al. | 427/255 |
| 3,503,368 | 3/1970 | Pudliner | 118/49.1 |
| 3,635,771 | 1/1972 | Shaw | 427/91 |
| 3,674,549 | 7/1972 | Ohshita et al. | 427/86 |
| 3,862,857 | 1/1975 | Gambino | 427/87 |

FOREIGN PATENT DOCUMENTS

1218067  6/1966  Fed. Rep. of Germany ............. 427/86

*Primary Examiner*—Ralph S. Kendall
*Assistant Examiner*—Janyce A. Bell
*Attorney, Agent, or Firm*—Haseltine and Lake

[57] ABSTRACT

A method of applying a layer of a source substance over a recipient, consisting in that the substance of the source is converted to gas and then precipitated onto the surface of the recipient, wherein the substance is, according to the invention, applied over at least one intermediate body and then the substance is transferred from the intermediate body onto the recipient.

15 Claims, 33 Drawing Figures

METHOD OF APPLYING LAYERS OF SOURCE SUBSTANCE OVER RECIPIENT AND DEVICE FOR REALIZING SAME

This is a continuation of application Ser. No. 756,609 filed Jan. 4, 1977 now abandoned.

This invention relates to coating and production of semiconductor materials and, in particular, to methods of applying a layer of a source over a recipient and device for their realization. The invention is employed for applying various coatings, for growth of semiconductor materials on a substance, as well as for imparting specified properties to the surface of the recipient.

There is known a method of application of a layer of a source substance over a recipient by sublimation and a device for its realization.

When the source substance is applied over the recipient by sublimation, the source is heated, the substance is evaporated from its surface and precipitated on the surface of the recipient. In order to obtain a solid solution based on two compounds by this method the substances used as the source should be ground. In this case deleterious impurities can be added to the source compounds, which deteriorate electrical parameters of the grown solid solutions.

Besides, the temperature of the source should be higher than the temperature of the recipient.

There is also known a method of applying the substance of a source onto a recipient by chemical gas transport reaction and a device for its realization.

During gas transport reactions the substance of the source is transferred by the action of a carrier agent onto the surface of the recipient, whereon a precipitate of the source substance is formed.

There can be three methods of applying a layer of the source substance on the recipient by means of the chemical gas transport reaction:

1. Transfer of the substance at a sufficiently high vacuum of the order to 0.01 mm Hg is performed according to the molecular beams mechanism. This transfer mechanism is characterized by low velocities.

2. Diffusive transfer of the substance at a vessel pressure of 0.1 to 2 atm.

In this case the transfer velocity is completely determined by the process of diffusion of the gaseous products of chemical reactions in the clearance between the source and the recipient.

3. Transfer of the substance in the flow of the carrier gas (flow method). In this case the substance is transferred in the direction of the gas flow only. Besides, the efficiency of the transfer is low.

Besides, all the above described methods of substance transfer require that the direction of the temperature drop from the source to the recipient is kept constant for each transferred substance and for each chemical gas transport reaction.

Devices for application of a layer of the source substance onto the recipient comprise a vessel housing a source of the substance and a recipient, and heaters ensuring the temperature drop between the source and the recipient. The recipient is located at a sufficiently close distance from the source and a temperature difference is produced.

When the substance is transferred by the gas transport reaction, the vessel is filled with the gaseous carrying agent.

It is an object of this invention to eliminate the dependance of the direction and velocity of the substance transfer upon the direction and quantity of the temperature difference between the source and the recipient.

Another object of this invention is to ensure isolation of the source and the recipient.

Yet another object of the invention is to increased the velocity and efficiency of the substance transfer.

Still another object of this invention is to eliminate the dependence of the direction and velocity of the substance transfer upon the direction of the gas flow containing the carrying agent.

This is achieved by that in a method of applying a layer of the source substance onto the recipient consisting in that the substance of the source is converted to gas and then precipitated onto the surface of the recipient, the substance of at least one source is, according to the invention, applied on at least one intermediate body and then the substance is transferred from the intermediate body onto the recipient.

It is possible that the source substance be applied to the intermediate body and then from said intermediate body to the recipient by sublimation.

It is also possible that the substance of the source be applied onto the intermediate body and then from the intermediate body to the recipient by the chemical gas transport reaction in the presence of a carrying agent.

It is also possible that the substance of the source be applied onto the intermediate body by sublimation, whereas the substance is transferred from the intermediate body to the recipient by chemical gas transport reaction in the presence of a carrying agent.

It is possible that the substance of the source is applied onto the intermediate body by the chemical gas transport reaction in the presence of the carrying agent and the substance is transferred from the intermediate body onto the recipient by sublimation.

It is advisable that in order to control the ratio of the transferred substance components the substance of the source be applied onto the intermediate body with one carrying agent and the substance is transferred from the intermediate body onto the substance in the pesence of another carrying agent.

it is advantageous that substances from at least two different sources be applied onto one intermediate body.

It is convenient that substances from each different source is applied on separate intermediate bodies and then each substance be applied from each intermediate body onto one and the same recipient.

It is possible that, when the source substance is transferred from the intermediate body onto the recipient, the substance of the intermediate body is partially converted to gas and applied to the recipient together with the source substance.

A device for realization of the method of applying a source substance onto a recipient, comprising a vessel; wherein at least one source of the substance, a recipient of the substance, and at least one heater are housed, includes according to the invention, at least one intermediate body located in the vessel and a displacement mechanism ensuring location of the operational surface of the intermediate body near the surface of the source, when the source substance is transferred to the intermediate body, and location of the operational surface of the intermediate body near the surface of the recipient, when the substance is transferred from the intermediate body to the recipient.

It is advisable that the intermediate body be connected by an axle to the displacement mechanism ensuring rotation of the intermediate body about said axle.

It is convenient that the substance source and the recipient be placed on at least one holder connected by an axle to the displacement mechanism ensuring rotation of the holder about said axle.

It is also advisable that the intermediate body be connected by a rod to the displacement mechanism ensuring reciprocation of the intermediate body.

It is convenient that the substance source and recipient be placed on at least one holder connected by a rod to the displacement mechanism ensuring reciprocating and progressive motion of the holder.

It is advisable that a part of the operational surface of the intermediate body be made of a material inhibiting condensation of the source substance.

It is also advisable that portions be made on the operational surface of the intermediate body, which shape is similar to the shape of portions on the recipient surface.

The present invention permits perfect epitaxial monolayer and multilayer structures, as well as solid solutions made up of separated starting components, these solid solutions being either uniform or with specified variations of composition in the layer.

The invention permits transfer of the source substance onto localized portions of the recipient, as well as capture of the substance from localized portions of the source without specially produced portions for selective growth on the recipient and portions of the substance to be transferred on the source.

The invention also permits simplification of the process of applying a substance layer of a complicated pattern on hard-to-reach spots of the recipient.

The invention will now be described in greater detail with reference to a specific embodiment thereof, taken in conjunction with the accompanying drawings, wherein:

FIG. 1 shows application of a layer of a source substance onto an intermediate body, according to the invention;

FIG. 2 shows movement of the intermediate body from the substance source to the substance recipient, according to the invention;

FIG. 3 shows application of a substance layer from the intermediate body to the substance recipient, according to the invention;

FIG. 4 shows application of a layer of the substance of the first source onto the intermediate body, according to the invention;

FIG. 5 shows application of a layer of the substance of another source onto the intermediate body, according to the invention;

FIG. 6 shows application of a layer of the substance from the intermediate body onto the recipient, according to the invention;

FIG. 7 shows application of a layer of the substance from two sources onto two intermediate bodies, according to the invention;

FIG. 8 shows application of a layer of the substance from one intermediate body onto the recipient, according to the invention;

FIG. 9 shows application of a layer of the substance from another intermediate body on one and the same recipient, according to the invention;

FIG. 10 shows application of a layer of the source substance as islands onto an intermediate body, according to the invention;

FIG. 11 shows application of a layer of the substance of the islands and the intermediate body onto the recipient, according to the invention;

FIG. 12 shows simultaneous application of the source substance onto the intermediate body and of the substance from the intermediate body onto the recipient, according to the invention;

FIG. 13 shows a device for application of a source substance onto the recipient, wherein the source and the recipient are rigidly secured, when the source substance is applied onto an intermediate body, according to the invention;

FIG. 14 shows the device of FIG. 13, when the substance is transferred from the intermediate body onto the recipient, according to the invention;

FIG. 15 shows a device for applying a layer of the source substance onto the recipient, wherein the intermediate body can be rotated about a horizontal axle, when the source substance is transferred onto the intermediate body, according to the invention;

FIG. 16 shows the device of FIG. 15, when the source substance is transferred to the intermediate body and simultaneously transferred from the intermediate body onto the recipient, according to the invention;

FIG. 17 shows a device for applying a layer of the source substance onto the recipient, wherein the intermediate body can be rotated about its vertical axis, according to the invention;

FIG. 18 shows a vessel featuring three sources and one recipient, according to the invention;

FIG. 19 shows a device for applying a layer of the source substance onto the recipient, wherein the intermediate body is made as hollow cylinder and featuring one source and three recipients, according to the invention;

FIG. 20 shows the device of FIG. 19 featuring three sources and one recipient, accordign to the invention;

FIG. 21 shows a device for application of a layer of the source substance onto the recipient, wherein the source and the recipient are placed on one holder capable of rotating about its vertical axis, when the source substance is applied onto the intermediate body, according to the invention;

FIG. 22 shows a holder with one source and three recipients, accoring to the invention;

FIG. 23 shows the device of FIG. 22, when the substance is transferred from the intermediate body to one of the recipients, accordisng to the invention;

FIG. 24 shows a device for applying a layer of the source substance onto the recipient, wherein the intermediate body is capable of reciprocating and progressive motion, according to the invention;

FIG. 15 shows a device for applying a layer of the source substance onto the recipient, wherein the source and the recipients are place on one holder capable of reciprocating and progressive motion, when the source substance is applied onto the intermediate body, according to the invention;

FIG. 26 shows the device of FIG. 25, when the substance is transferred from the intermediate body on one of the recipients, according to the invention;

FIG. 27 shows an intermediate body featuring portions of a specified pattern, accordidng to the invention;

FIG. 28 shows a device for applying a layer of the source substance onto the recipient, when the source substance is applied onto the intermediate body featuring portions of specified patterns, according to the invention;

Figure 1:
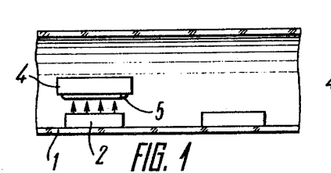

Referring to FIG. 1, a vessel 1 houses a source 2 of the substance, a substance recipient 3, an intermediate body 4 with a layer 5 of the substance of the source 2 applied thereon.

Figure 2:
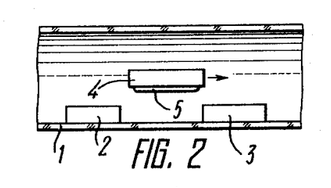

FIG. 2 illustrates the process of mechanical movement of the intermediate body 4 with the substance layer 5 from the source 2 to the recipient 3.

Figure 3:
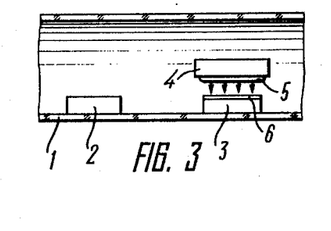

Referring to FIG. 3, the intermediate body 4 with a layer 5 of the substance of the source 2 is located over the operational surface of the recipient 3, whereon a layer 6 of the substance of the source 2 is applied.

Figure 4:
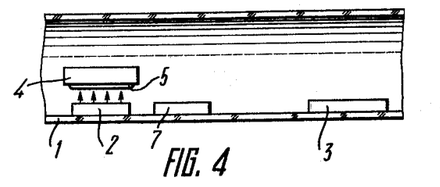

Two sources 2 and 7, an intermediate body 4 and a recipient 3 are provided in the vessel 1 (FIG. 4).

The intermediate body 4 is located near the surface of the substance source 2.

A layer 5 of the substance of the source 2 is applied on the intermediate body 4.

Figure 5:
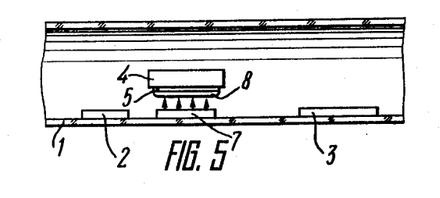

Referring to FIG. 5, the intermediate body 4 with the layer 5 of the substance of the source 2 is located near the surface of a substance source 7.

Figure 6:
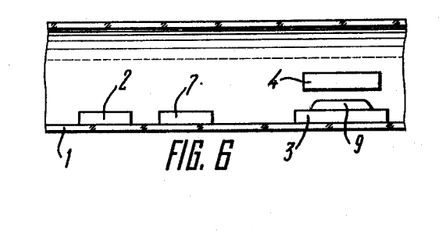

Referring to FIG. 6, the intermediate body 4 is located near the operational surface of the recipient 3 with a layer 9 comprising components of the substance of the source 2 and the substance of the source 7.

The vessel 1 (FIG. 7) houses a substance source 2, a substance source 10, a recipient 3, an intermediate body 4 and an intermediate body 11. The intermediate body 4 is located near the substance source 2 and a layer 5 of the substance of the source 2 is applied thereon. The intermediate body 11 is located near the substance source 10 and a layer 12 of the substance of the source 10 is applied thereon.

Figure 8:
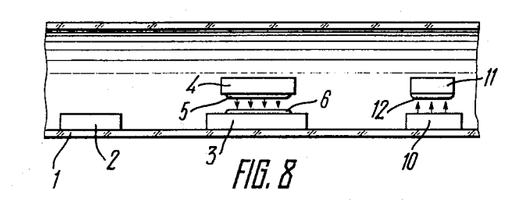

Referring to FIG. 8, the intermediate body 4 with a layer 5 is positioned near the recipient 3, whereon a layer 6 of the substance of the source 2 is applied.

Figure 9:
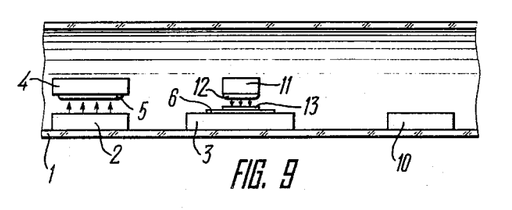

Referring to FIG. 9, an intermediate body 11 with a layer 12 is located near the recipient 3. A layer 13 of the substance of the source 10 is applied over the recipient 3 with a layer 6.

Figure 10:
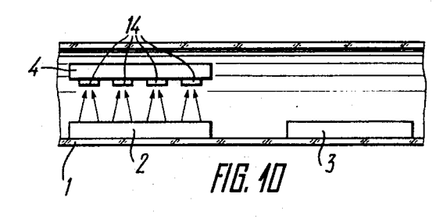

Referring to FIG. 10, the intermediate body 4 is located near the source 2. The substance of the source 2 is applied onto the intermediate body 4 as islands 14.

Figure 11:
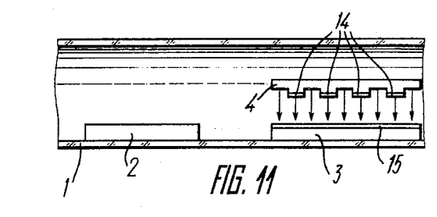

Referring to FIG. 11, the intermediate body 4 is located near the recipient 3. A layer 15 composed of the components of the substance of the source 2 and the substance of the intermediate body 4 is applied over the recipient 3.

Figure 12:
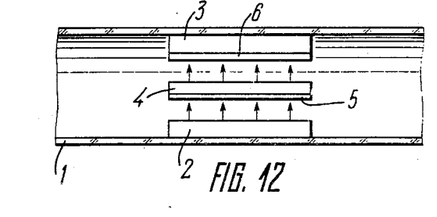

Referring to FIG. 12, the intermediate body 4 is located between the source 2 and the recipient 3. A layer 5 of the substance of the source 2 is applied onto the intermediate body 4. A layer 16 of the substance of the intermediate body 4 is applied onto the recipient 3.

Figure 13:
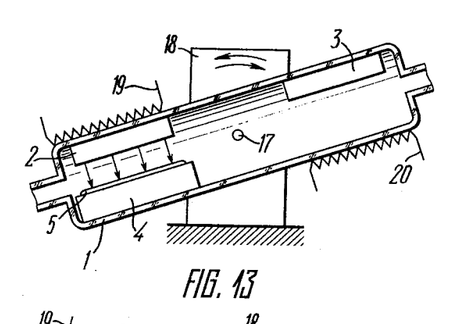

FIG. 13 illustrates a vessel 1 housing a source 2 and a recipient 3 rigidly secured therein. The vessel 1 is connected to a displacement mechanism 18 by means of an axle 17.

The vessel 1 is provided with heaters 19 and 20. The vessel 1 is inclined in the direction of the source 2 and the intermediate body is located near the source 2. A layer 5 of the substance of the source 2 is applied onto the intermediate body 4.

The vessel 1 (FIG. 14) is inclined in the direction of the recipient 3, whereon a layer 6 of the substance of the source 2 is applied.

The intermediate body 4 (FIG. 15) is connected by an axle 21 to the displacement mechanism 18. The vessel 1 is provided with a heater 22 of the source 2 and a heater 23 of the recipient 3. A layer 5 of the substance of the source 2 is applied on the intermediate body 4.

Figure 16:
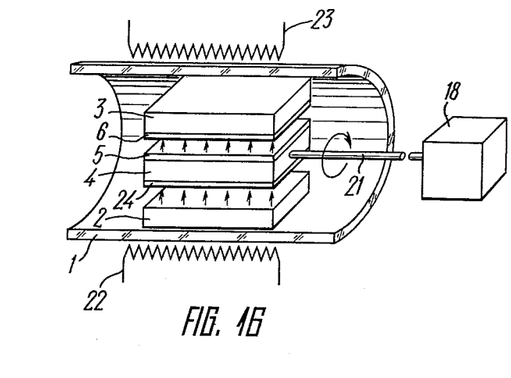

Referring to FIG. 16, the layer 5 of the substance of the source 2 faces the recipient 3, whereas a layer 24 of the substance of the source 2 is applied onto the opposite side of the intermediate body 4. A layer 6 of the substance of the source 2 is applied onto the recipient 3.

The intermediate body 4 (FIG. 17) is made as a disk connected by an axle 25 to a displacement mechanism (not shown). The intermediate body 4 is located in the vessel 1 so that one part of the disk is positioned over the substance source 2 and the other part of the disk is positioned over the substance recipient 3. The vessel 1 is provided with a heater 26 of the source 2, a heater 27 of the recipient 3, a heater 28 of the part of the intermediate body 4 located over the source 2, a heater 29 of the part of the intermediate body 4 located over the recipient 3. A layer 5 of the substance of the source 2 is applied onto the part of the intermediate body 4 located over the source 2. A layer 30 of the substance of the source 2 is applied onto the part of the intermediate body 4 located over the recipient 3. A layer 31 of the substance of the source 2 is applied onto the recipient 3.

Figure 18:
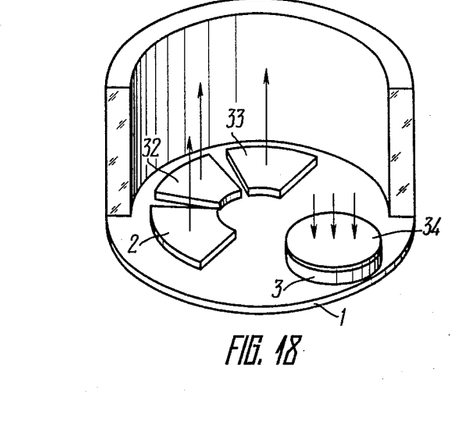

The vessel 1 (FIG. 18) houses three sources 2, 32 and 33 and a substance recipient 3. A layer 34 made up of components of the substance of the source 2, the substance of the source 32 and the substance of the source 33 is applied onto the recipient 3.

The intermediate body 4 (FIG. 19) is made as a hollow cylinder, heaters 35 and 36 being placed therein. The intermediate body 4 is connected by an axle 37 to a displacement mechanism (not shown). The vessel 1 houses a substance source 2 and recipients 3, 38 and 39. The vessel 1 is provided with a heater 40 of the substance source 2 and a heater 41 of the recipients 3, 38 and 39. A layer 5 of the substance of the source 2 is applied onto the part of the intermediate body 4 located near the source 2. A layer 42 of the substance of the source 2 is applied onto the part of the intermediate body 4 located near the recipients 3, 38 and 39. A layer 43 of the substance of the source is applied onto the recipient 3, a layer 44 of the substance of the source 2 is applied onto the recipient 38 and a layer 45 of the substance of the source 2 is applied onto the recipient 39.

The vessel 1 (FIG. 20) houses three sources 2, 46 and 47. The intermediate body 4 is also made as a hollow cylinder. A layer 48 containing components of the substance of the source 2, the substance of the source 46 and the substance of the source 47 is applied onto the intermediate body 4. A layer 49 containing components of the substance of the source 2, the substance of the source 46 and the substance of the source 47 is applied onto the recipient 3. The vessel 1 is provided with heaters 50 and 51. The intermediate body 4 is provided with heaters 52 and 53.

The vessel 1 (FIG. 21) houses a substance source 2, three recipients 3, 54 and 55 (54 and 55 not shown) and an intermediate body 4. The source 2 and the recipients 3 (54 and 55) are located on one holder 56. The holder 56 is connected by an axle 57 to a displacement mechanism (not shown) ensuring rotation of the holder 56 about the axle 57. The vessel 1 houses heaters 58 and 59. The heater 58 is intended to heat the intermediate body 4. The heater 59 is placed under the part of the holder 56 located under the intermediate body 4. The substance source 2 is positioned under the intermediate body 4, whereon a layer 5 of the substance of the source 2 is applied.

Figure 22:
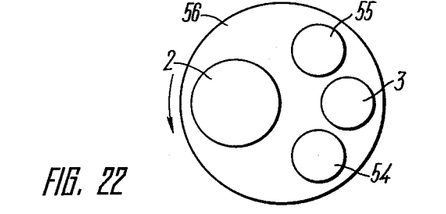

FIG. 22 illustrates the holder 56, whereon the substance source 2 and the substance recipients 3, 54, and 55 are located.

Figure 23:
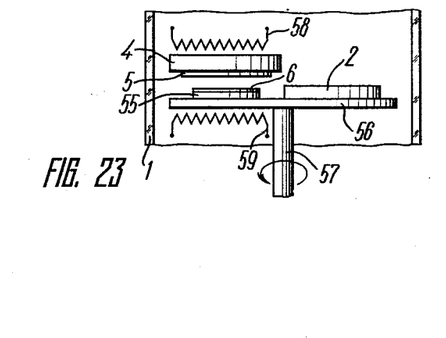

Referring to FIG. 23, the substance recipient 55 is located under the intermediate body 4, whereon a layer 6 of the substance source 2 is applied. The substance recipient 3 is located over the heater 59.

The vessel 1 (FIG. 24) houses a substance source 2, a substance recipient 3 and an intermediate body 4 connected by a rod 60 to a displacement mechanism 61 ensuring reciprocation of the intermediate body 4. The vessel 1 is provided with heater 62,63,64,65.

The vessel 1 (FIG. 25) houses a substance source 2, recipients 3 and 66, an intermediate body 4. The source 2 and the recipients 3 and 66 are located on one holder 67 connected by a rod 68 to a displacement mechanism 69 ensuring progressive and reciprocal motion of the holder 67. The vessel 1 is provided with a heater 70 intended for heating the intermediate body 4 and a heater 71 located from the opposite side of the vessel 1. The substance source 2 is located under the intermediate body 4, whereon a layer 5 of the substance of the source 2 is applied. The intermediate body 4 is positioned over the heater 71.

Figure 26:
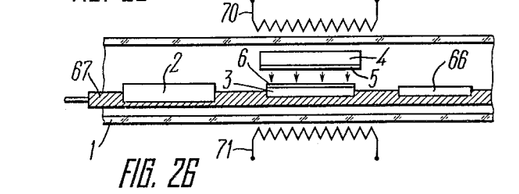

Referring to FIG. 26, the recipient 3 of the substance is located under the intermediate body 4 and a layer 6 of the substance of the source 2 is applied thereon.

A part 72 (FIG. 27) of the surface of the intermediate body 4 is made of a material preventing condensation of the source substance. Portions 73 of the surface of the intermediate body 4 are made of a material condensing the substance of the source.

The vessel 1 (FIG. 28) houses a substance source 2, a substance recipient 3 and an intermediate body 4.

Figure 28:
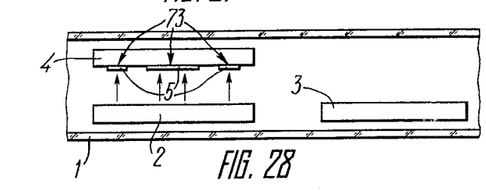

A layer 5 of the substance of the source 2 is applied on the portions 73 of the intermediate body 4.

The intermediate body 4 is positioned over the substance source 2.

Figure 29:
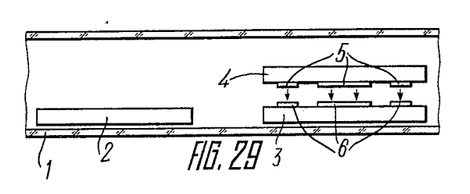
FIG. 29 shows the device of FIG. 28, when the substance is transferred from the intermediate body onto the recipient, according to the invention.

Referring to FIG. 29, the intermediate body 4 is located over the substance recipient 3. A layer 6 of the substance of the source 2 is applied on the recipient 3.

Figure 30:
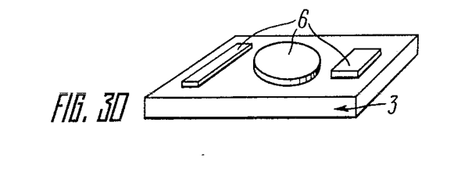
FIG. 30 shows a recipient with a layer of the substance arranged as portions of specified patterns, according to the invention.

Referring to FIG. 30, a layer 6 of the source substance is applied on the recipient 3. The layer 6 is made as selective portions which shape and arrangement correspond to the shape and arrangement of the portion 73 (FIG. 27) of the intermediate body 4.

The intermediate body 4 (FIG. 31) made as a cylinder with a layer 5 of the source substance applied thereon is located inside the recipient 3 made as a hollow cylinder. A layer 6 of the source substance is applied on the inner surface of the cylinder. The inner surface of the recipient 3 is similar to the outer surface of the intermediate body 4.

The intermediate body 4 (FIG. 32) made as a plate with a layer 5 of the source substance applied over its outer surface is located in a rectangular opening 74 made in the recipient 3. The inner surface of the rectangular opening 74 is coated by a layer 6 of the source substance.

The recipient 3 (FIG. 33) is provided with an opening 75. The intermediate body 4 is provided with a portion 76 which shape is similar to the configuration of the opening 75. The portion 76 of the intermediate body 4 is coated by a layer 5 of the source substance. A part of the surface of the opening 75 is coated by a layer 6 of the source substance.

Sources can be liquid, powder and solid.

Recipients can be liquid, monocrystalline and polycrystalline bodies of any material capable of condensing the substance of the source on their surface.

The basic requirements for the material of the intermediate body: capability to condense the substance of the source on its surface.

The directions of the substance transfer and movement of the elements of the device are indicated by arrows in the drawings.

In the process of applying the substance of the source 2 (FIG. 1) onto the recipient 3, the substance of the source 2 is converted to gas by sublimation or chemical gas transport reaction and then the layer 5 of the substance is applied onto the intermediate body 4, on which operational surface the substance of the source 2 is condensed. Then the intermediate body 4 (FIG. 2) with the layer 5 of the substance is carried mechanically to the substance recipient 3 so that the operational surface of the intermediate body 4 is located near the surface of the recipient 3 (FIG. 3). Then the substance layer 5 is converted to gas by sublimation or chemical gas transport reaction and applied onto the surface of the recipient 3, whereon this substance is condensed.

FIGS. 4 through 6 illustrate the process of applying the substance from two sources 2 and 7 onto one intermediate body 4. At first the substance of the source 2 is applied onto the intermediate body 4 to obtain the layer 5. Then the substance of the source 7 is applied over the layer 5 to obtain the layer 8. Then the intermediate body 4 is moved to the recipient 3, whereon the layer 9 made up of the components of the layer 5 and the layer 7 is applied.

Figure 7:
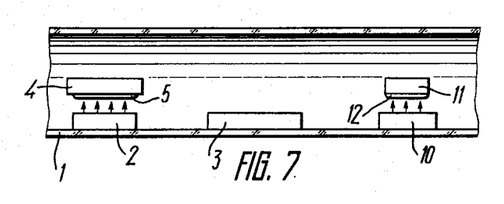

FIGS. 7 through 9 illustrate the process of applying the substance of two sources 2 and 10 onto separate intermediate bodies 4 and 11, respectively.

At first the substance of the source 2 is applied onto the intermediate body 4 to obtain the layer 5 and the substance of the source 10 is applied onto the intermediate body 11 to obtain the layer 12. Then the substance of the layer 5 is applied onto the recipient 3 to obtain the layer 6. Then the substance of the layer 12 from the intermediate body 11 is applied over the layer 6 to produce the layer 13.

FIGS. 10 and 11 illustrate one of the embodiments of the method, when the intermediate body 4 is made of a material converted to gas either by sublimation or by gas transport reaction. The subtance of the source 2 is precipitated selectively over the surface of the intermediate body 4 (FIG. 10) as the islands 14.

The intermediate body is placed near the surface of the recipient 3 (FIG. 11) and conditions are provided for transfer of the substance from the intermediate body 4 onto the surface of the recipient 3. The distance between the surfaces of the intermediate body 4 and the recipient 3 is set larger that the size of the largest portion of one composition. In these conditions the substance is transferred both from the surface of the islands 14 and from the opened surface of the intermediate body 4. As a result the uniform substance layer 15 is applied onto the surface of the intermediate body 4, which comprises components of the substance of the source 2 and the substance of the intermediate body 4. In case the distance between the surface of the intermediate body 4 and the surface of the recipient 3 is less than the minimum size of a uniform composition portion on the surface of the intermediate body 4, the composition of the precipitated layer 15 on the surface of the recipient 3 becomes nonuniform.

When the intermediate body 4 (FIG. 12) is made of a substance converted to gas, it is placed between the surfaces of the source 2 and the recipient 3. With such arrangement, if the temperature of the intermediate body 4 is lower than the temperature of the source 2 but higher than the temperature of the recipient 3, the substance of the source 2 is precipitated as the layer 5 on the surface of the intermediate body 4 facing the source 2. The substance of the intermediate body 4 on it opposite side facing the recipient 3 is transferred onto the surface of the recipient 3 as the layer 16. Conditions for transfer of the substances are selected so that the growth speed of the layers 5 and 16 are equal. Gradually the whole substance of the intermediate body 4 is transferred to the surface of the recipient 3 and the intermediate body 4 changes its composition completely. Its composition now corresponds to the composition of the layer 5 received from the source 2. From this moment on the substance transferred onto the surface of the recipient 3 has a different composition as compared to the initial composition of the intermediate body 4. This variant is employed, for example, when the substance of the source is powder-like. In this case transfer and growth of small crystals of the substance of the source 2 into the layer 16 precipitated on the surface of the recipient 3 is prevented.

EXAMPLE 1

Any substance that can be sublimed can be transferred by means of sublimation.

The source of the substance, the intermediate body and the recipient of the substance, which are provided with heaters, are placed into the vessel. A pressure of the order of $1.10^{-4}$–$1.10^{-5}$ mm Hg is produced in the vessel. The source is solid or powder cadmium selenide. A plate of sapphire is used as the intermediate body. A monocrystalline substrate of cadmium sulfide with the orientation /1120/ is used as the recipient. The temperature of the source is kept as 700° C. In this case cadmium selenide is converted to the gaseous phase and precipitated on the sapphire plate (intermediate body) which temperature is maintained at about 400° C. A cadmium selenide layer is produced on the sapphire plate and its thickness depends on the time of the substance transfer.

The intermediate body is then carried to the vessel zone (or to another vessel), wherein the recipient on the substance is located. The intermediate body is heated to the temperature of 700° C. and the recipient is heated to the temperature of about 500° C. In this case cadmium selenide is sublimed from the intermediate body into the substrated surface of the substrate of cadmium sulfide (recipient) and forms an epitaxial film with a shining smooth surface.

EXAMPLE 2 chemical gas transport reactions are used to transfer substances which chemical reactions are revesible.

The source of the substance is a mechanical mixture of powdered gallium phosphide and gallium arsenide. The content of the gallium phosphide is 20 mole percent. A quartz plate is used as the intermediate body and a monocrystalline substrate of gallium arsenide is used as the recipient. The substance of the source is applied over the intermediate body by chemical gas transport reaction in hydrogen, steam being used as the carrying agent. The thermodynamic direction of the substance transfer process in this chemical system; from the high temperature zone to the lower temperature zone. It should be noted that this method permits reverse process, that is from the less heated source to the more heated recipient, by changing the temperature of the intermediate body, the gas flow in the vessel being directed from the recipient to the source of the substance.

The intermediate body (quartz plate) heated to 750° C. is brought to the substance source heated to 870° C.

Gallium phosphide and gallium arsenide are transferred by steam to the quartz plate (intermediate body), producing a precipitate which is a solid solution of gallium phosphide-arsenide. The intermediate body is then moved to the recipient of the substance. The intermediate body is heated to 950° C. and the recipient is heated to 920° C. In this case gallium phosphide-arsenide is precipitated on the gallium arsenide substrate (recipient).

In this way the substance is transferred from the source heated to 870° C. to the recipient heated to 920° C., that is from a less heated body to more heated one.

Metallographic analyses of the epitaxial layer of the solid solution of gallium phosphide-arsenide grown on the substrate of gallium arsenide demonstrate complete absence of grown particles of the second phase (particles of the powder source), which is quite common with direct transfer of the substance of the powder source on the recipient. In this case the particles of the source substance pass to suspension and grown into the epitaxial layer.

This method, therefore, permits production of a high quality epitaxially grown layer.

EXAMPLE 3

Separation and isolation of the processes of applying the source substance onto the intermediate body and from the intermediate body onto the recipient permits various combinations of these processes. For example, the substance of the source is transferred onto the intermediate body by sublimation and then the substance is transferred from the intermediate body to the recipient by gas transport reaction.

The vessel is divided into two zones. The source of the substance, which is zinc telluride, and the intermediate body made as a sapphire plate are placed in the first zone. The substance recipient made as a substrate of gallium arsenide is placed in the second zone. The fist zone is evacuated to $1.10^{-4}$–$1.10^{-5}$ mm Hg. The second zone is filled with hydrogen under a pressure of about 1 atm. The source (zinc telluride) is heated to the temperature of about 700° C. and the intermediate body (sapphire plate) is heated to the temperature of about 400° C. In this case a zinc telluride layer is applied over the sapphire plate by sublimation. The intermediate body is then placed into the second zone of the vessel through a gate door. The intermediate body is heated to 750° C. and the recipient (gallium arsenide) is heated to 700° C. The chemcial gas transport reaction takes place in hydrogen.

As a result zinc telluride is transferred to the recipient and precipitated as an epitaxial layer. The zinc telluride epitaxial layer grown by the above described method has a better structure than that obtained by sublimation.

If there are non-evaporating admixtures in the source, they are not transferred to the intermediate body by sublimation and, consequently, non-volatile admixutres would not be transported to the recipient.

EXAMPLE 4

The vessel is divided into two zones.

The first zone is occupied by the substance source which is zinc telluride and the intermediate body of gallium arsenide. The recipient of cadmium sulfide is placed in the second zone isolated from the first one.

A mask made of silica and provided with open windows with a diameter of about 10 mu is placed on the surface of the intermediate body.

Hydrogen under the pressure of 1 atm is supplied to the source zone. The substance source is heated to 750° C. and the intermediate body is heated to 700° C. The intermediate body is brought to the substance source to a distance of about 1 mm. In this case a layer of the source substance (zinc telluride) is applied over the portions of the intermediate body unprotected by the mask by means of the chemical gas transport reaction of zinc telluride and hydrogen.

The intermediate body is then carried to the second zone. A vacuum $1.10^{-4}$–$1.10^{-5}$ mm Hg is provided in this zone. The intermediate body is placed at aa distance of 1-2 mm from the recipient. The temperature of the intermediate body is 700° C. and of the recipient 500° C. In this case zinc telluride is applied over cadmium sulfide (recipient) by sublimation.

The thickness of the epitaxially grown layer is proportional of the surface density of localized portions of zinc telluride in the intermediate body.

Since the substance transfer speed in vacuum can be made significantly less than with chemical gas transport reaction, the above described method permits production of a layer of the substance (zinc telluride) on the recipient with a varying thickness of up to 5,000 A.

EXAMPLE 5

This method permits substance transfer from the source to the intermediate body and from the intermediate body to the recipient by chemcial gas transport reaction with different carrying agents.

The source is made of gallium arsenide, the intermediate body is made of a quartz plate, th recipient is made of monocrystalline gallium arsenide. The first zone of the vessel contains the substance source and the intermediate body.

The carrying agent in this case is hydrogen with water (humidified hydrogen). The source is heated to 850° C. and the intermediate body is heated to 720° C. A layer of gallium arsenide is applied over the intermediate body in this case.

The intermediate body is then placed into the second zone, wherein hydrogen chloride is used as the carrying agent. The intermediate body is heated to 800° C. and the recipient is heated to 750° C. Gallium arsenide is transferred from the intermediate body onto the recipient.

Change of the carrying agent makes for additional purification of the transferred substance. When the source substance (gallium arsenide) is transferred onto the intermediate body by chemical gas transport reaction in the humidified hydrogen medium, it is only the components capable of forming volatile oxides that are converted to gas and, consequently, transferred to the intermediate body. The remaining components, including uncontrollable admixtures, e.g. iron, chrome, molybdenum, stay in the source. In this way gallium arsenide applied onto the intermediate body is cleaned of undesirable admixtures. Chlorine hydride used for transfer of gallium arsenide from the intermediate body onto the recipient gives better results during epitaxial growth than humidified hydrogen and permits higher quality growing of the gallium arsenide layer on the substrate made of gallium arsenide with the orientation /100/.

The above described variant of th method is employed to prepare profiled sources for further use.

EXAMPLE 6

The substance of each different source is transferred onto the recipient by means of separate intermediate bodies. The solid solution of gallium phosphide-arsenide and gallium arsenide can be selectively grown on a substrate by means of two sources, one source being made of the gallium phosphide-arsenide solid solution and the other being made of gallium arsenide. The intermediate bodies are mde of polished quartz plates.

The first intermediate body is provided with a portion made as a circle with a diameter of 500 mu and the second intermediate body is provided with a portion made as a circle with a diameter of 300 mu. Said portion are made of gold which is capable of condensing the substances of the sources. A layer of gallium phosphide-arsenide is applied over the first intermediate body and a layer of gallium arsenide is applied over the second intermediate body by means of the chemical gas transport reaction (with steam as the carrying agent). In this case the intermediate bodies are heated to 880° C., gallium phosphide-arsenide is heated to 930° C. and gallium arsenide is also heated to 930° C. After that the first intermediate body is heated to 950° C. and brought closer to the recipient heated to 920° C. so that the distance between the surface of the recipient and the intermediate body amounts to 20 mu. Water vapours are used as the carrying agent. A layer of gallium phosphide-arsenide is locally applied over the recipient as a circle with a diameter of 50 mu. Then the first intermediate body is taken away and the second intermediate body is brought to the recipient to a distance of 20 mu so that the center of the circle layer on the surface of the recipient coincides with the center of the layer on the second intermediate body.

The second intermediate body is also heated to 950° C. In this case a layer of gallium arsenide with a diameter of about 300 mu is applied over the layer of gallium phosphidearesenide with a diameter of 500 mu.

Separate intermediate bodies are most advisable to employ, when epitaxial structures are grown from substances with different types of conductance or differently doped substances, since in this case the substance of one source does not contaminate the substance of the other source.

EXAMPLE 7

The substance of the intermediate body is converted to gas and partially precipitated on the recipient.

A gallium phosphide plate is used as the source of the substance, a gallium arsenide plate is used as the intermediate body and a gallium arsenide substrate is used as the recipient. A layer of the solid solution of gallium phosphide-arsenide with a definite content of gallium phosphide is to be grown on the gallium arsenide substrate. The source plate is covered by a mask, e.g. of silica, provided with through openings with a diameter of about 200 mu. The openings in the mask are uniformly distributed over the surface of the source. Humidified hydrogen is employed as the carrying agent.

The source (gallium phosphide) is heated to 950° C., the intermediate body (gallium arsenide) is heated to 900° C. and they are brought together to a distance of 20 mu. Localized islands of gallium phosphide are applied (through the mask openings) onto the intermediate body by the chemical gas transport reaction. Localized gallium phosphide portions are evenly distributed over the surface of the intermediate body.

The intermediate body is then carried to the substance recipient zone.

The intermediate body is heated to 960° C. and the recipient is heated to 930° C. A layer of the subtance from the intermediate body (gallium phosphide and gallium arsenide) is applied over the recipient in the humidified hydrogen medium by means of chemical gas transport reaction. In this manner the epitaxial layer which is the solid solution of gallium phosphide-arsenide with a specified content of gallium phosphide is precipitated onto the recipient.

The device for realization of the disclosed method operates as follows.

Figure 14:
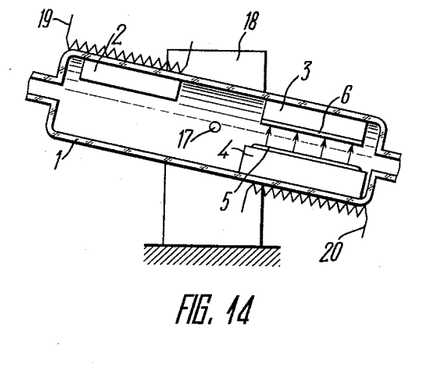

FIGS. 13 and 14 illustrate a device for applying the substance of the source 2 onto the surface of the recipient 3 by means of the intermediate body 4. The intermediate body 4 (FIG. 13) lies freely on the wall of the vessel 1. In this position, when the vessel 1 is inclined in the direction of the source 2, the intermediate body 4 is located near the surface of the source 2. The source 2 is heated by means of the heater 19. After the layer 5 of the specified thickness is applied over the surface of the interme- diate body 4, the vessel 1 is rotated about the axle 17 by means of the mechanism 18 and inclined in the other direction. The intermediate body 4 (FIG. 14) rolls down on the wall of the vessel 1 and locates itself near the surface of the recipient 3. The substance of the layer 5 is transferred onto the surface of the recipient 3 by heating the intermediate body 4 by the heater 20 and the layer 6 is precipitated on said surface of the recipient 3.

Figure 15:
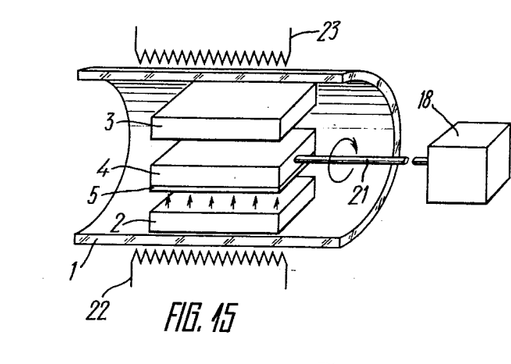

FIGS. 15 and 16 illustrate a device, wherein the intermediate body 4 is positioned between the surfaces of the source 2 and the recipient 3, which are heated by the heaters 22 and 23, respectively, to the temperatures ensuring transfer of the substance of the source 2 onto the recipient 3.

The intermediate body 4 (FIG. 15) is located between the heated source 2 and the recipient 3 and its temperature is lower than the temperature of the source 2, but higher than the temperature of the recipient 3 (considering the case of substance transfer from a more heated body onto a less heated one). At first the layer 5 of the substance of the source 2 having a specified thickness is applied over the surface of the intermediate body 4 facing the source 2 (arrows indicate the transfer direction). Then the intermediate body 4 is turned through 180° about the axle 21 (FIG. 16) by means of the mechanism 18. The substance of the layer 5 is transferred in this position from the surface of the intermediate body 4 facing the recipient 3 onto the surface of the recipient 3, whereon the layer 6 of the substance of the source 21 is produced. At the same time the layer 24 of the substance of the source 2 is applied over the surface of the intermediate body 4 facing the source 2. The intermediate body 4 is periodically turned through 180° about the axle 21 and the substance of the source 2 is transferred onto the recipient 3 by batches. One plate of the recipient 3 can be changed for another at the moment the intermediate body 4 is turned, if necessary.

Figure 17:
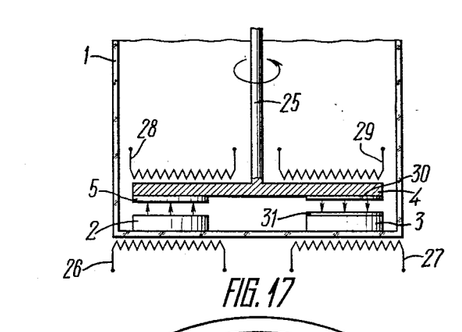

FIG. 17 illustrates a device for continuous transfer of the substance of the source 2 onto the recipient 3. For this purpose the intermediate body 4 is made as a disk and placed so that its upper and lower surfaces are parallel to the surfaces of the source 2 and the recipient 3 located in the vessel 1. The intermediate body 4 is connected to the axle 25 perpendicular to the disk plane. The axle 25 is intended for rotation of the intermediate body 4. A temperature difference is produced in the zone of the source 2 by the heaters 26 and 28 between the source 2 and the intermediate body 4, which ensures transfer of the substance of the source 2 onto the surface of the intermediate body 4 located at this moment over the surface of the source 2. The layer 5 of the substance of the source 2 is precipitated on this part of the surface of the intermediate body 4. A temperature difference ensuring transfer of the substance from the intermediate body 4 to the recipient 3 is produced in the zone of the recipient by means of the heaters 27 and 29.

As a part of the intermediate body 4 passes over the surface of the recipient 3, the layer 30 of the substance of the source 2 is transferred from the surface of the intermediate body 4 to the surface of the recipient 3, whereon the layer 31 of the substrate of the source 2 is produced. The layer 30 on the surface of the intermediate body 4 has the same compositior as the layer 5. The intermediate body 4 is rotated about the axle 25 and continuous transfer of the substance of the source 2 onto the recipient 3 is effected.

Figure 19:
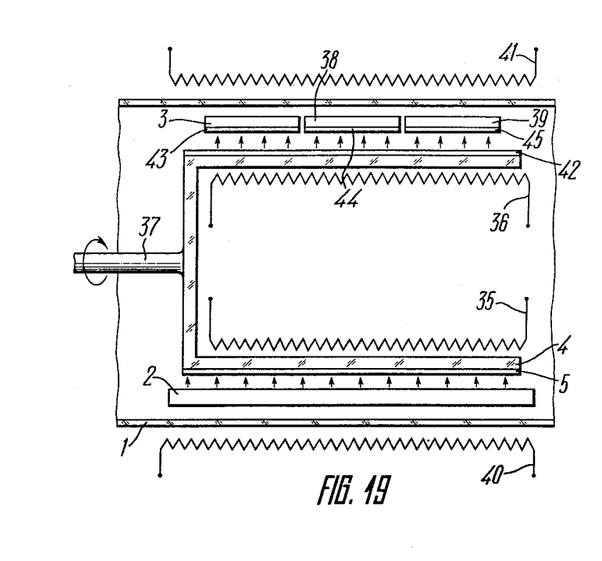

FIG. 19 illustrates a device for transfer of the substance of the source 2 to the recipients 3, 38, 39, wherein the intermediate body 4 is made as a cylinder capable of rotating about the axle 37.

The source 2 is placed in the lower zone of the vessel 1 and the recipients 3, 38 and 39 are located in the upper zone. A temperature difference is produced in the source zone by means of the heaters 40 and 35 to ensure transfer of the substance of the source 2 to the part of the surface of the intermediate body 4 located over the surface of the source 2. The layer 5 is applied on this part of the surface of the intermediate body 4. The cylinder can rotate about the axle 37. The heaters 36 and 41 produce the temperature difference ensuring transfer of the substance from the surface of the intermediate body 4 to the recipients 3, 38 and 39. The layer 42 corresponding to the layer 5 after the cylinder turn is precipitated on the surface of the recipients 3, 38, 39 as respective layers 43, 44, 45. The substance of the source 2 is transferred onto the surface of several recipients 3, 38 and 39 by means of constant rotation of the intermediate body 4.

Figure 20:
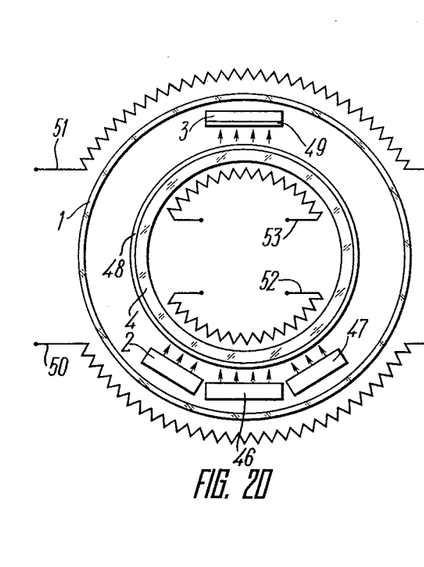

FIG. 20 illustrates a lateral section of the vessel 1, wherein the intermediate body 4 is also made as a cylinder. The layer 49 including components of the substance of the sources 2, 46, 47 is applied onto the surface of the recipient 3 by means of placing several sources 2, 46, 47 of different composition in the lower part and by rotating the cylinder about its longitudinal axle (not shown).

The heaters 50 and 52 are intended to produce the temperature difference between the sources 2, 46, 47 and a part of the surface of the intermediate body 4 ensuring transfer of the substances of the sources 2, 46, 47 onto the intermediate body 4. The heaters 51 and 53 are intended to provide conditions for transfer of the substance of the layer 48 onto the recipient 3 as the layer 49 which composition is made up of components of the substances 2, 46, 47 in appropriate quantities. The substances of the sources can be transferred on several recipients (10-30) simultaneously by placing several rows of recipients (not shown in FIG. 20) in the upper part of the vessel along its axis.

Figure 21:
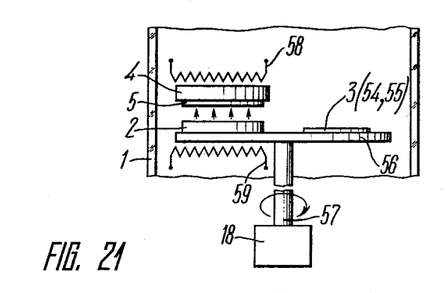

Referring to FIGS. 21, 22 and 23, an embodiment of the device comprises the intermediate body 4 which is fixed rigidly and the holder 56 which can be moved and carries the source 2 and the recipients 3, 54, 55. The heaters 58 and 59 are intended to produce the specified temperature difference ensuring transfer of the substance in the specified direction. At first the temperature difference is produced to ensure transfer of the substance of the source 2 onto the intermediate body 4. Then, after the layer 5 of a specified thickness is applied over the intermediate body 4, the holder 56 is turned and the source 2 is removed from under the intermediate body 4 and one of the recipients, e.g. the recipient 55 (FIG. 23) is brought thereto. As soon as the first of the three recipients (recipient 55) is brought to the intermediate body 4, the heaters 58 and 59 produce the temperature difference ensuring transfer of the substance of the layer 5 from the intermediate body 4 onto the recipient 55. The layer 6 is thus applied over the surface of the recipient 55. By successive bringing of the recipients 3 and 54 the layer 5 is applied on the surfaces of these recipients 3 and 54. This embodiment of the device is used in cases, when the substance of the source is to be applied over several recipients.

Figure 24:
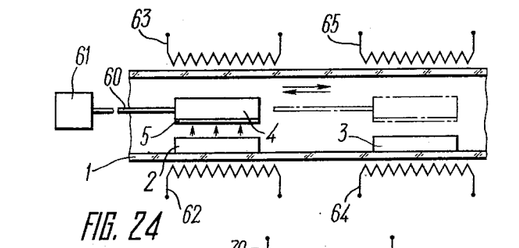

Referring to FIG. 24, the device comprises the intermediate body 4 connected by the rod 60 to the mechanism 61, which reciprocates from the source 2 to the recipient 3 and back. The heaters 62 and 63 are intended to produce the temperature difference ensuring transfer of the substance from the source 2 onto the surface of the intermediate body 4 and the heaters 64 and 65 are intended to produce the temperature difference ensuring transfer of the substance of the source 2 from the intermediate body 4 onto the recipient 3. After the layer 5 is applied onto the surface of the intermediate body 4, the intermediate body 4 is moved by the mechanism 61 to the surface of the recipient 3 (this position is indicated in FIG. 24 by a dash line), where the substance is transferred from the intermediate body 4 onto the recipient 3. The intermediate body 4 is then returned to the surface of the source 2 for another batch of the substance of this source 2 and the whole process is repeated. The substance of the source can be transferred by means of such device in batches to alternating recipients.

Figure 25:
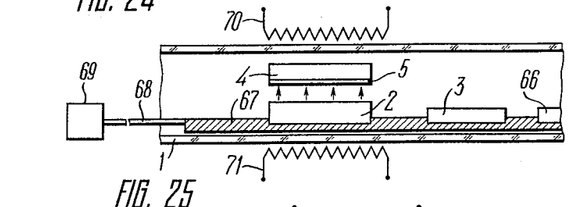

FIGS. 25 and 26 illustrate a device for applying the substance of the source 2 successively on several recipients (e.g. 10 or 50) by means of the fixed intermediate body 4. The source 2 and the recipients 3, 66, etc. are placed on one holder 67 made as a conveyor. This holder 67 is connected by means of the rod 58 to the mechanism 69 ensuring progressive motion of the holder 67. The heaters 71 and 70 initially produce the temperature difference ensuring transfer of the substance of the source 2 onto the intermediate body 4. After the layer 5 of a specified thickness is applied over the surface of the intermediate body 4, the holder 67 is moved so that the recipient 3 is under the intermediate body 4 (FIG. 26). Here the heaters 70 and 71 produce the temperature difference between the intermediate body 4 and the recipient 3 ensuring transfer of the substance of the layer 5 onto the surface of the recipient 3. When the layer 6 of a specified thickness is applied over the recipient 3, the holder 67 is moved so that the next recipient 66 comes under the intermediate body 4 and the process of applying the substance is repeated.

Figure 27:
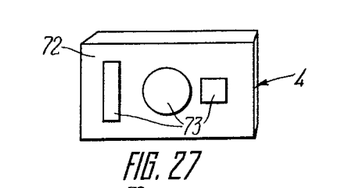

Referring to FIG. 27, the intermediate body 4 is provided with portions 72 and 73 of different materials on its surface. Gaseous substances are not condensed on the portions 72, whereas the portions 73 condense these substances. When the intermediate body 4 is brought to the source 2 (FIG. 28), the substance of the source 2 is applied over the portions 73 only. After the layers 5 are applied over the portions 73 on the surface of the intermediate body 4, this intermediate body 4 is brought to the surface of the recipient 3 (FIG. 29). The distance between the surface of the intermediate body 4 and the recipient 3 being small (10-100 mu), the substance of the source 5 is transferred only on those portions of the surface of the recipient 3, which are located directly under the portions of the intermediate body 4, whereon the substance of the source 2 has been previously applied as the layer 5. In this manner the layer 6 (FIG. 30) is applied over the recipient 3 as portions which configuration corresponds to the configuration of the portions 73 (FIG. 27) on the surface of the intermediate body 4.

Figure 31:
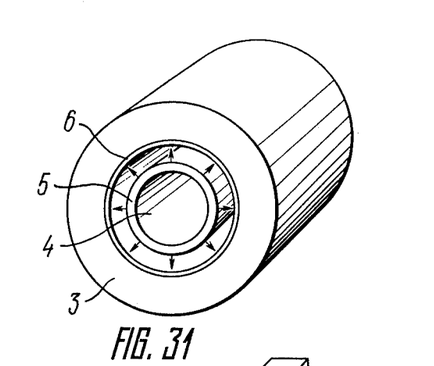
FIG. 31 shows an intermediate body and a recipient made as cylinders, according to the invention.

Referring to FIG. 31, the intermediate body 4 made as a cylinder is used to apply the substance of the layer 5 over the inner cylindrical surface of the recipient 3, whereon the layer 6 of the substance is produced. In order to transfer the substance of the layer 5 onto the inner cylindrical surface of the recipient 3, an appropriate temperature difference is produced between the intermediate body 4 and the recipient 3. The substance of definite properties is thus applied over the surface of openings in various parts.

Figure 32:
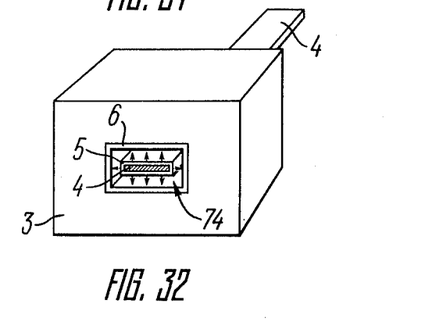
FIG. 32 shows an intermediate body made as a plate and fitted into a rectangular opening made in the recipient, according to the invention.

Referring to FIG. 32, an embodiment of the intermediate body 4 is made as a plate to apply a substance of definite properties over the inner surface of the intermediate opening of the recipient 3. For this purpose the substance layer 5 is at first applied over the surface of the intermediate body 4 and then the intermediate body 4 is fitted into the opening 74 of the recipient 3. By producing the temperature difference ensuring transfer of the substance of the layer 5 from the surface of the intermediate body 4 onto the inner surface of the openings 74 of the recipient 3 the layer 6 is applied.

Figure 33:
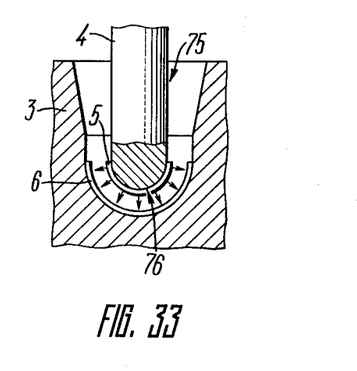
FIG. 33 shows an intermediate body, a part of its surface being similar to a part of the recipient surface, according to the invention.

Referring to FIG. 33, an embodiment of the intermediate body 4 is intended for applying a substance of definite properties over the spherical surface of the opening 75 of the recipient 3. For this purpose, the layer 5 is at first applied onto the spherical portion 76 of the intermediate body 4 and then the intermediate body 4 is placed into the opening 75 of the recipient 3. The layer 6 is applied onto the spherical portion of the opening 75 of the recipient 3 by producing the temperature difference required to transfer the substance from the intermediate body onto the recipient 3.

Intermediate bodies 4 of different shapes, as illustrated in FIGS. 31, 32 and 33, permit applying of coatings in hard-to-get-at places and intricate openings.

The present invention permits elimination of the dependence of the direction and speed of substance transfer upon the direction and magnitude of the temperature difference from the source to the recipient and upon the direction of the gas flow, e.g. it permits application of the substance from a less heated source to a more heated recipient, as well as transfer to the substance from the source to the recipient in the direction opposite to the direction of the gas flow.

Besides, the invention ensures isolation of the source from the recipient, which permits elimination of the undesirable influence of the source upon the recipient, as well as production of substance layers characterized by a high accuracy of the specified properties.

The invention also permits higher efficiency of the substance transfer by transporting condensed substance.

What is claimed is:

1. A device for applying a layer of at least one source substance onto a receipient, utilizing a gaseous carrying agent, comprising:

a vessel adapted to house said recipient and said source and to be filled with a gaseous carrying agent at least one intermediate body having a operational surface capable of condensing said source substance, said body being spatially separated from said source and from said recipient in said vessel:

at least one heater ensuring a specified temperature difference between said source and said intermediate body and between said intermediate body and said recipient; and a displacement mechanism ensuring location of said operational surface of said intermediate body near the surface of said source, when the substance of said source is applied onto said intermediate body, and location of said operational surface of said intermediate body near the surface of said recipient, when the substance is transferred from said intermediate body onto said recipient.

2. A device as claimed in claim 1, comprising:

an axle connecting said intermediate body to said displacement mechanism;

said displacement mechanism ensuring rotation of said intermediate body about said axle.

3. A device as claimed in claim 1, comprising:

at least one holder, whereon said source and said recipient are placed;

an axle connecting said holder to said displacement mechanism;

said displacement mechanism ensuring rotation of said holder about said axle.

4. A device as claimed in claim 1, comprising:

a rod connecting said intermediate body to said displacement mechanism;

said displacement mechanism ensuring reciprocating motion of said intermediate body.

5. A device as claimed in claim 1, comprising:

at least one holder, whereon said source and said recipient are placed;

a rod connecting said holder and said displacement mechanism;

said displacement mechanism ensuring progressive and reciprocating motion of said holder.

6. A device for applying a layer of at least one source substance onto a recipient, utilizing a gaseous carrying agent, comprising:

a vessel adapted to house said recipient and said source and to be filled with a gaseous carrying agent;

at least one intermediate body having part of its operational surface capable of condensing said source substance and the other part made of a material impeding condensation of said source substance, said body being spatially separated from said source and from said recipient in said vessel;

at least one heater ensuring a specified temperature difference between said source and said intermediate body and between said intermediate body and said recipient; and a displacement mechanism ensuring location of said operational surface of said intermediate body near the surface of said source, when the substance of said source is applied onto said intermediate body, as well as location of said operational surface of said intermediate body near the surface of said recipient, when the substance is trasferred from said intermediate body onto said recipient.

7. A device as claimed in claim 6, comprising:

an axle connecting said intermediate body to said displacement mechanism;

said displacement mechanism ensuring rotation of said intermediate body about said axle.

8. A device as claimed in claim 6, comprising:

at least one holder, whereon said source and said recipient are placed;

an axle connecting said holder to said displacement mechanism;

said displacement mechanism ensuring rotation of said holder about said axle.

9. A device as claimed in claim 6, comprising:

a rod connecting said intermediate body to said displacement mechanism;

said displacement mechanism ensuring reciprocating motion of said intermediate body.

10. A device as claimed in claim 6, comprising:

at least one holder, whereon said source and said recipient are located;

a rod connecting said holder and said displacement mechanism;

said displacement mechanism ensuring progressive and reciprocating motion of said holder.

11. A device for applying a layer of at least one source substance onto a recipient having portions of complicated patterns on the surface thereof, utilizing a gaseous carrying agent, comprising:

a vessel adapted to house said recipient and said source and to be filled with a gaseous carrying agent;

at least one intermediate body having an operational surface capable of condensing said source substance and corresponding in shape to the surface of said recipient, said body being spatially separated from said source and from said recipient in said vessel;

at least one heater ensuring a specified temperature difference between said source and said intermediate body and between said intermediate body and said recipient; and a displacement mechanism ensuring location of said operational surface of said intermediate body near the surface of said source, when the substance of said source is applied onto said intermediate body as well as location of said operational surface of said intermediate body near the surface of said recipient, when the substance is transferred from said intermediate body onto said recipient.

12. A device as claimed in claim 11, comprising:

an axle connecting said intermediate body to said displacement mechanism;

said displacement mechanism ensuring rotation of said intermediate body about said axle.

13. A device as claimed in claim 11, comprising:

at least one holder, whereon said source and said recipient are placed;

an axle connecting said holder to said displacement mechanism;

said displacement mechanism ensuring rotation of said holder about said axle.

14. A device as claimed in claim 11, comprising:

a rod connecting said intermediate body to said displacement mechanism;

said displacement mechanism ensuring reciprocating motion of said intermediate body.

15. A device as claimed in claim 11, comprising:

at least one holder, whereon said source and said recipient are placed;

a rod connecting said holder and a displacement mechanism;

said displacement mechanism ensuring progressive and reciprocating motion of said holder.

* * * * *